(12) United States Patent
Schwoerer

(10) Patent No.: US 8,233,582 B2
(45) Date of Patent: Jul. 31, 2012

(54) HIGH DYNAMIC RANGE COULOMB COUNTER WHICH SIMULTANEOUSLY MONITORS MULTIPLE SENSE RESISTORS

(75) Inventor: Christoph Sebastian Schwoerer, Grasbrunn (DE)

(73) Assignee: Linear Technology Corporation, Milpitas, CA (US)

( * ) Notice: Subject to any disclaimer, the term of this patent is extended or adjusted under 35 U.S.C. 154(b) by 61 days.

(21) Appl. No.: 12/960,299

(22) Filed: Dec. 3, 2010

(65) Prior Publication Data
US 2012/0139611 A1 Jun. 7, 2012

(51) Int. Cl.
G06M 11/02 (2006.01)
(52) U.S. Cl. .................................. 377/12; 377/95
(58) Field of Classification Search .......... None
See application file for complete search history.

(56) References Cited

U.S. PATENT DOCUMENTS

| | | | |
|---|---|---|---|
| 6,856,922 B1 * | 2/2005 | Austin et al. | 702/63 |
| 7,750,612 B2 * | 7/2010 | Yokosawa | 323/282 |
| 7,801,600 B1 * | 9/2010 | Carbunaru et al. | 607/2 |
| 2011/0125434 A1 * | 5/2011 | Shen et al. | 702/63 |
| 2011/0234173 A1 * | 9/2011 | Kao et al. | 320/150 |
| 2011/0298473 A1 * | 12/2011 | Irmer et al. | 324/601 |

OTHER PUBLICATIONS

Intersil Americas Inc. Data Sheet FN9074.1,ISL 6295 Low Voltage Fuel Gauge. Nov. 10, 2005, 25 pages.
Isabellenhutte Heusler GmbH & Co KG. Data Sheet IHM-A-1500, Front End Data Acquisition for Battery Management System in Automotive Applications, May 11, 2002. 46 pages.
Maxim Integrated Products/Dallas Semiconductor Corporation. Data Sheet 19-4637, Maxim DS2786, Stand-Alone OCV-Based Fuel Gauge. May, 2009, 22 pages.
Maxim Integrated Products. Data Sheet 19-4683, DS2741, Current Monitor and Accumulator with Integrated Sense Resistor. Jul. 2009, 10 pages.
Maxim Integrated Products/Dallas Semiconductor Corporation. Data Sheet 19-4631, Maxim DS2745, Low-Cost I2C Battery Monitor. May 2009, 15 pages.
Maxim Integrated Products/Dallas Semiconductor Corporation. Data Sheet 19-4633, Maxim DS2756, High-Accuracy Battery Fuel Gauge with Programmable Suspend Mode. May 2009, 27 pages.
Maxim Integrated Products/Dallas Semiconductor Corporation. Data Sheet 19-4634, Maxim DS2780, Standalone Fuel Gauge IC. May 2009, 31 pages.
STMicroelectronics, STC 3100, Battery Monitor IC with Coulomb Counter/Gas Gauge. Jan. 2009, 21 pages.

* cited by examiner

Primary Examiner — Tuan Lam
(74) Attorney, Agent, or Firm — McDermott Will & Emery LLP

(57) ABSTRACT

A circuit may include a source of electrical energy and a plurality of current loads. Each load may be of a different amount. For each current load, a resistance may be in series between the source and the current load. The resistance may be weighted inversely proportional to the amount of the current load with respect to the other resistances. For each resistance, an integrator may generate an integrated output representative of an integration of the current traveling through the resistance. A summer may generate a summed output which is representative of the sum of each of the integrated outputs, weighted inversely proportional to the resistance that is associated with the integrated output.

17 Claims, 4 Drawing Sheets

HIGH DYNAMIC RANGE COULOMB COUNTER WHICH SIMULTANEOUSLY MONITORS MULTIPLE SENSE RESISTORS

BACKGROUND TECHNICAL FIELD

This disclosure relates to accurately monitoring the charge of a battery over a very wide dynamic range.

DESCRIPTION OF RELATED ART

Accurate knowledge of the state of a battery's charge can be important in several applications, such as in connection with electric vehicles.

Battery voltage is sometime monitored and equated with a measure of this charge. However, the relationship between battery voltage and the state of charge of a battery can fluctuate as a function of other conditions, such as temperature and battery usage history.

Coulomb counters can measure the electrical charge which enters or leaves a battery. A low resistance may be place in series between the battery and its load. The voltage across the resistance may be measured and equated to the current which enters or leave the battery. This voltage may be integrated, thus providing a measure of the charge of the battery.

The battery current in some applications, such as electric vehicles, may vary from several hundred amps to only a few milliamps. The dynamic range of coulomb counters, however, may not be sufficient to accurately measure these currents over such a wide dynamic range. For high currents, the dynamic range may be limited by the maximum voltage drop across the sense resistor and/or by its power dissipation capability. For small currents, the dynamic range may be limited by an offset from the voltage measuring circuit and/or by parasitic thermocouples in a connection to the sense resistor.

Some coulomb counters include a set of different-valued resistors and switch in the resistor with the value that is most appropriate for the level of current which is flowing. This approach, however, may require costly, high-current switches. It may also not always provide the needed accuracy due to losses caused by resistance in the switches.

SUMMARY

A circuit may include a source of electrical energy and a plurality of current loads. Each load may be of a different amount. For each current load, a resistance may be in series between the source and the current load. The resistance may be weighted inversely proportional to the amount of the current load with respect to the other resistances. For each resistance, an integrator may generate an integrated output representative of an integration of the current traveling through the resistance. A summer may generate a summed output which is representative of the sum of each of the integrated outputs, weighted inversely proportional to the resistance that is associated with the integrated output. As each integrator may monitor the voltage drop over a sense resistor appropriate to the amount for the current load connected to it, the required dynamic range of each integrator may be reduced with respect to a single integrator monitoring the whole current range. Therefore the overall accuracy of coulomb counting may be increased.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details which may be apparent or unnecessary may be omitted to save space or for more effective illustration. Some embodiments may be practiced with additional components or steps and/or without all of the components or steps which are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details which may be apparent or unnecessary may be omitted to save space or for a more effective presentation. Some embodiments may be practiced with additional components or steps and/or without all of the components or steps which are described.

Figure 1:
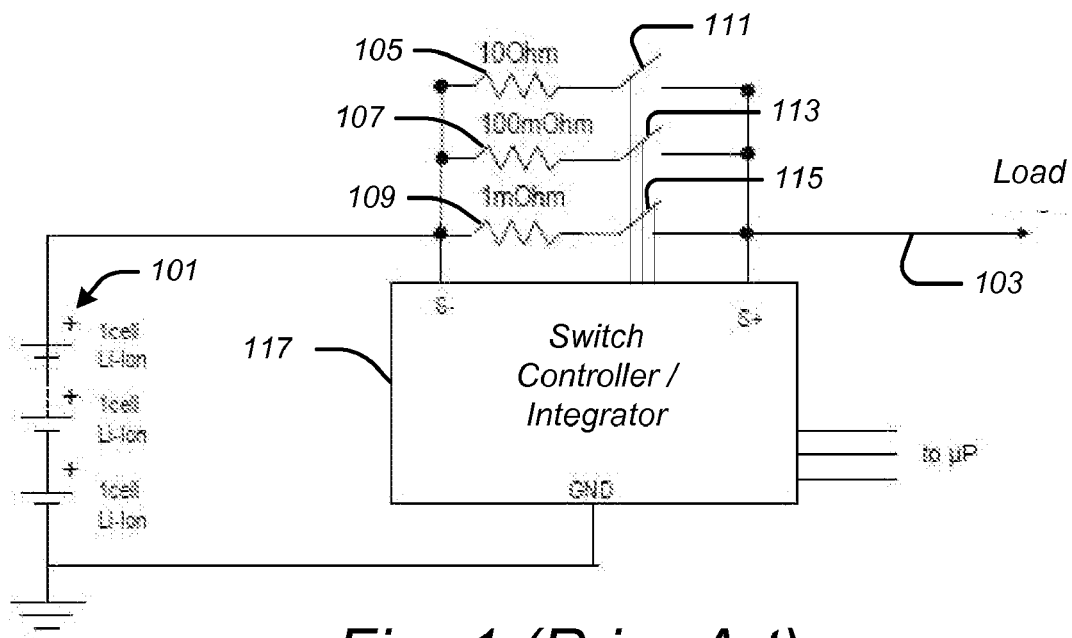
FIG. 1 illustrates a prior art coulomb counter which has multiple resistors, only one of which is switched in series with a load at any one time.

FIG. 1 illustrates a prior art coulomb counter which has multiple resistors, only one of which is switched in series with a load at any one time. (As used herein, the term "load" is also intended to embrace a charger that may be used to deliver energy back into the energy source.) As illustrated in FIG. 1, rechargeable batteries 101 may be used to supply electrical energy to a load through a load output 103. One of resistors 105, 107, or 109, may be switched in series with the circuit between the rechargeable batteries 101 and the load output 103 by an electronic switch 111, 113 or 115, respectively. The state of each electronic switch may be controlled by a switch controller/integrator 117.

The switch controller/integrator may switch in the resistance which is most appropriate for the level of current which is being drawn. When a low current is being drawn, for example, a resistance with a high value may be switched in. When a high current is being drawn, on the other hand, a resistance with a low value may be switched in. The voltage which is developed across the switched-in resistance may be integrated by an integrator contained within the switch controller/integrator 117. The result of the integration may be indicative of the charge within the energy source, such as the rechargeable batteries 101.

At least some of the electronic switches may need to conduct a large amount of current. This can make these switches expensive and bulky. Even then, these electronic switches may have an amount of resistance, when closed, which is sufficiently high to inject an error in the measuring process.

Figure 2:
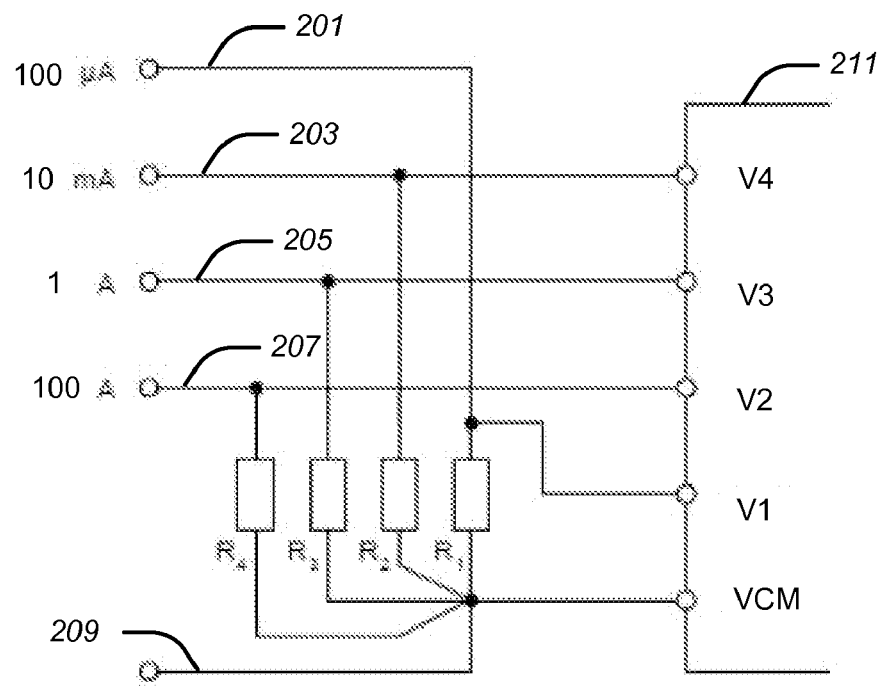
FIG. 2 illustrates a prior art ampere meter with different current-level inputs.

FIG. 2 illustrates a prior art ampere meter with different current-level inputs. As illustrated in FIG. 2, the amp meter includes a plurality of input connectors, such as input connectors 201, 203, 205, and 207. A return connector 209 is also provided. Each input connector can be used to measure current flow within a different range, such from 0-100 µA for input connector 201, 0-10 mA for input connector 203, 0-1 A for input connector 205, and for 0-100 A input connector 207. Sense resistors R1, R2, R3, and R4 complete the circuit, respectively, for each of the input connectors. The voltage across each resistor is measured by a voltage measuring circuit 211. This voltage provides a measure of the current which is traveling through the selected input connector.

Such an amperer meter, however, may require the user to select the appropriate input connector and to manually connect one lead of the circuit to it. A circuit of this type may therefore not be practical in systems which require accurate current measurements to be made over a wide dynamic range on an automated basis. This amp meter also does not provide a coulomb count.

Figure 3:
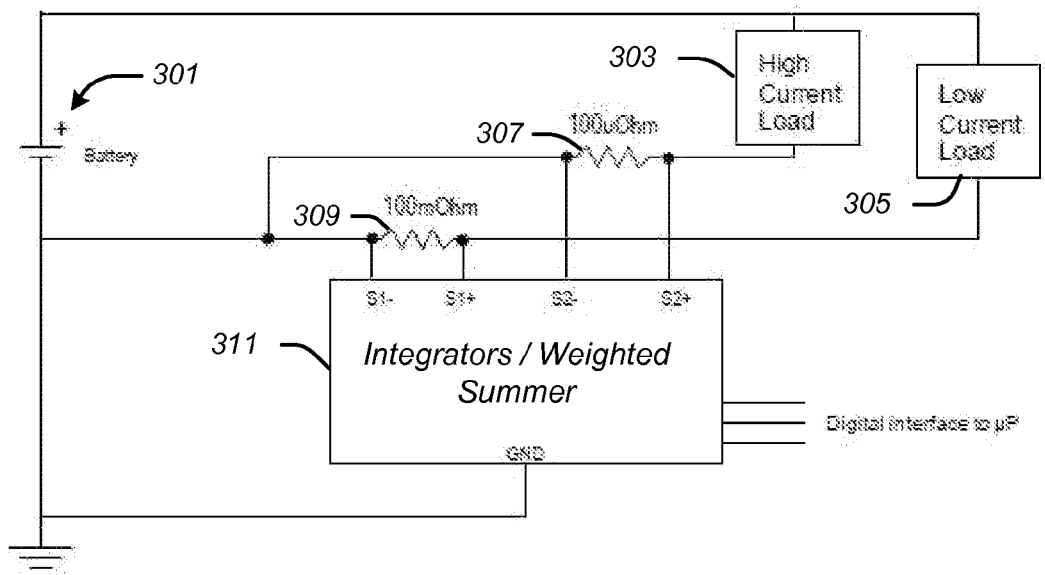
FIG. 3 illustrates an example of a circuit with an energy source, a high current load, a low current load, and a coulomb counter which includes multiple sense resistors which are monitored simultaneously.

FIG. 3 illustrates an example of an energy source, a high current load, a low current load, and a coulomb counter which includes multiple sense resistors which are monitored simultaneously. As illustrated in FIG. 3, an energy source, such as a rechargeable battery 301, may be connected to a plurality of loads, such as to a high current load 303 and a low current load 305. In turn, a sense resistance may be connected in series between the return path from each load and the energy source, such as a sense resistor 307 in series with the high current load 303 and a sense resistance 309 in series with the low current load 305. The voltage which is developed across each sense resistance may be delivered through a differential input to an integrators/weighted summer circuit 311. For example, the voltage developed across the sense resistor 309 may be delivered to a differential input S1−/S1+; and the voltage developed across the sense resistor 307 may be delivered to a differential input S2−/S2+.

The values of the sense resistances may be different. For example, the values may differ by an order of magnitude, by ten orders of magnitude, by even larger orders of magnitude, by smaller amounts, or by any amount in between. The values may be selected to be inversely proportional to the maximum current which is anticipated to be imposed by the current load on the leg of the circuit containing the sense resistance.

Figure 4:
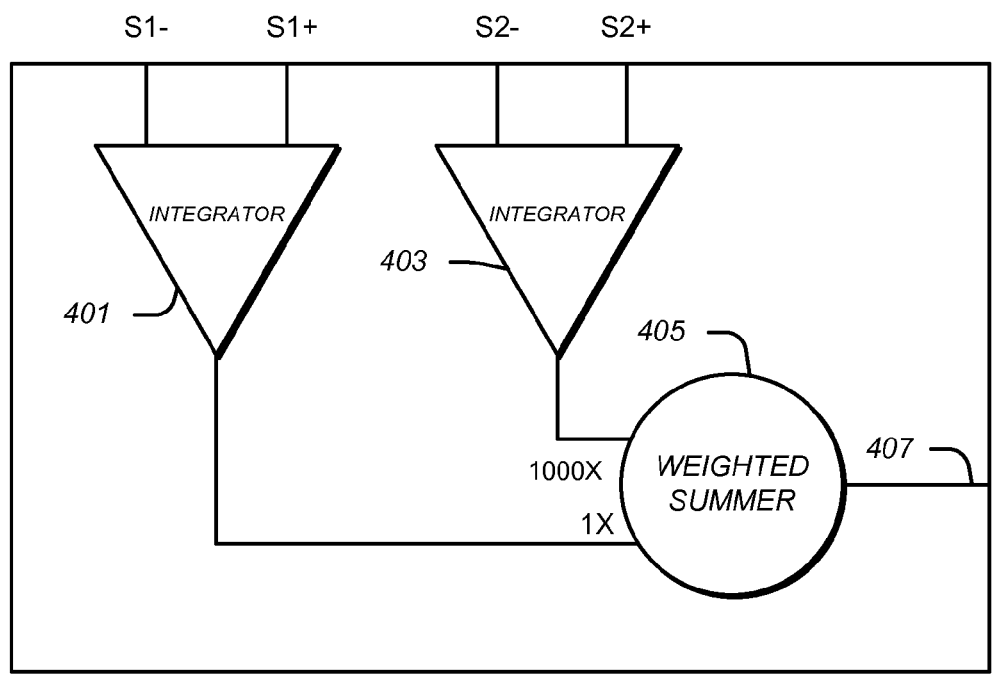
FIG. 4 is an example of the integrators and weighted summer illustrated in FIG. 3.

FIG. 4 is an example of the integrators and weighted summer illustrated in FIG. 3. As illustrated in FIG. 4, each differential input may be connected to its own integrator. For example, differential input S1−/S1+ may be connected to an integrator 401; and differential input S2−/S2+ may be connected to an integrator 403. Each integrator may be configured to generate an integrated output representative of an integration of the input signal to which it is connected.

The outputs of the integrators may be connected to weighted inputs of a weighted summer 405. For example, the output of the integrator 401 may be connected to the 1X input to the weighted summer 405, while the output of the integrator 403 may be connected to the 1000X weighted input of the weighted summer 405. The weighted summer 405 may be configured to generate a summed output which is representative of the sum of each of the integrated outputs, weighted inversely proportional to the resistance that is associated with the integrated output.

An output 407 of the weighted summer may thus represent the coulomb count of charge over a measurement period which is delivered to or received from the energy source, such as the rechargeable battery 301. The integrators and weighted summer may be configured to achieve these results. For example, the integrators and/or weighted summer may be configured to operate in the analog domain, the digital domain, or in a combination of both domains.

Figure 5:
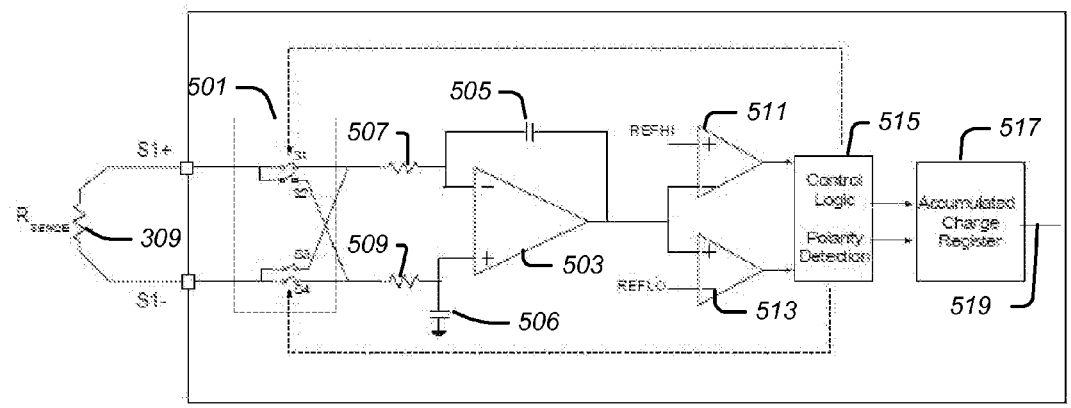
FIG. 5 is an example of a prior art integrator which integrates in the analog domain which may be used as for each of the integrators illustrated in FIG. 4.

FIG. 5 is an example of a prior art integrator which integrates in the analog domain. A replica of the circuit illustrated in FIG. 5 may be used as each of the integrators illustrated in FIG. 4.

As illustrated in FIG. 5, the differential signal from one of the sense resistances, such as the sense resistor 309, may be delivered through a switching network 501 to an analog integrator which may include an operational amplifier 503, capacitances 505 and 506, and input resistors 507 and 509. The output of the integrator may be delivered to comparators 511 and 513 which may be configured to compare the output to a high reference voltage REFHI and a low reference voltage REFLO, respectively. A control logic and polarity detection circuit 515 may be configured to detect the output states of the comparators 511 and 513. Each time these output states indicate that the output of the integrator has reached the high reference voltage or the low reference voltage, the control logic and polarity detection circuit 515 may be configured to cause the switching network 501 to switch states, so as to reverse the polarity of the connection between the differential input and the integrator. Polarity of the differential input voltage may be detected by evaluating the state of the switching network 501 and which of the comparators 511 and 513 has tripped. If the same comparator trips twice in a row, this may indicate that polarity of the input signal has been inversed. An accumulated charge register circuit 517 may be configured to maintain a count of each time the switching network 501 changes state. The accumulated charge register circuit 517 may be configured to increment the count when the polarity detection circuit detects positive polarity and the output of the integrator goes from the high reference voltage to the low reference voltage or vice versa. Similarly, the accumulated charge register circuit 517 may be configured to decrement the count when the polarity detection circuit detects negative polarity and the output of the integrator goes from the high reference voltage to the low reference voltage or vice versa. If the same comparator trips twice in a row, this may indicate that the polarity of the input signal has been reversed and the accumulated charge register is neither incremented or decremented. An output 519 of the accumulated charge register may thus be indicative of the amount of charge which has flowed through the resistance which is associated with the integrator illustrated in FIG. 5.

Figure 6:
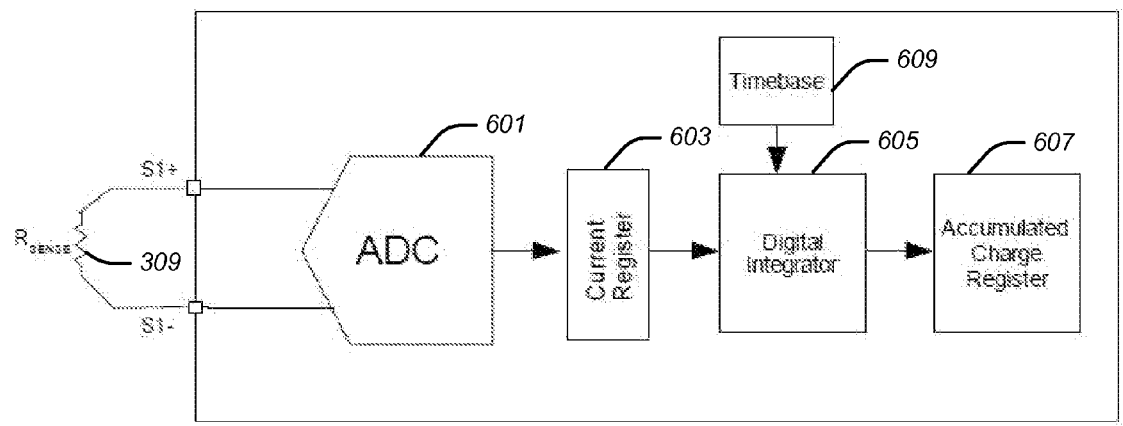
FIG. 6 is an example of a prior art integrator which integrates in the digital domain which may be used as each of the integrators illustrated in FIG. 4.

FIG. 6 is an example of a prior art integrator which integrates in the digital domain. A replica of the circuit illustrated in FIG. 6 may be used as each of the integrators illustrated in FIG. 4.

As illustrated in FIG. 6, the differential input voltage taken from one of the sense resistances, such as the sense resistor 309, may be converted to a digital signal by an analog-to-digital converter 601. A current register 603 may be configured to store the instantaneous current and may make it accessible via a digital interface. The output of the current register 603 may be delivered to a digital integrator 605 which, with accurate time information from a time base 609, may be configured to integrate the digital current measurement over time. The results of this integration may be stored in an accumulated charge register 607 that may be accessible via a digital interface.

Figure 7:
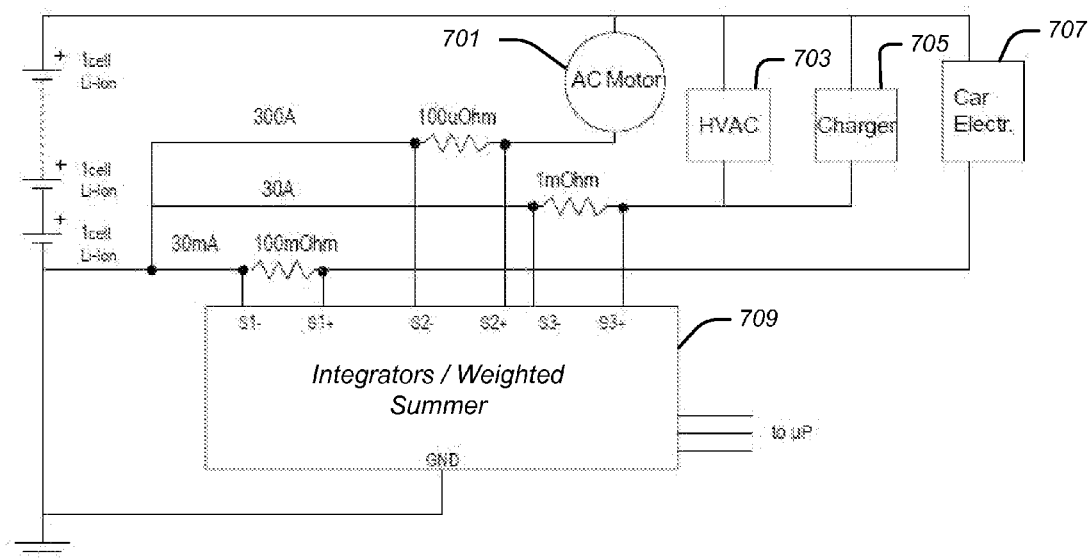
FIG. 7 is an example of an energy source, three current loads of different amounts, and a coulomb counter which includes multiple sense resistors which are monitored simultaneously.

FIG. 7 illustrates an example of an energy source, three current loads of different amounts, and a coulomb counter which includes multiple sense resistors which are monitored simultaneously. The circuit illustrated in FIG. 7 is essentially the same as the circuit illustrated in FIG. 3, except that the energy source is illustrated as containing a plurality of batteries and there are three separate current channels, not merely two.

The circuit illustrated in FIG. 7 also illustrates examples of different types of loads which might be appropriate to connect within the circuit when used in connection with an electric vehicle. These may include, for example, an AC motor 701 which may impose a very heavy load, a heating, ventilation, and air conditioning (HVAC) system 703 which may impose a moderate load, an energy source charger 705 which may deliver a modest amount of current, and car electronics 707 which may impose a very light load.

The circuit in FIG. 7 also illustrates that different loads may be connected to the same current-monitoring channel, such as the HVAC system 703 and the energy source charger 705.

Other circuits may have an even larger number of separately-monitored current channels.

In each instance, an integrators/weighted summer circuit 709 may be configured as illustrated in FIG. 4, except that the number of integrators may be the same as the number of separate current channels.

The various components which have been described may be integrated in any way. For example, the integrated/weighted summer circuit 311 and integrator/weighted summer circuit 709 may each be contained in a single composite integrated circuit. The sense resistors, such as the sense resistors 307 and 309, may or may not be contained within this integrated circuit.

Unless otherwise indicated, each of the circuits which have been illustrated herein in block format may be configured with appropriate electronic components to perform the functions which have been recited herein for each circuit.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

For example, the analog integrator might be realized by having S− directly connected to the negative input of the operational amplifier. Other types of analog integrator topology might be used instead. Also instead of using two comparators and inverting the integration direction, only one comparator might be used and the integrator might be reset each time it reaches a reference voltage.

Instead of a single, differential ADC, two single ended ADCs could be configured to convert the input voltages at S1+ and S1−, and the results could be subtracted before integration. In another implementation, the current register could be omitted and, the digital integrator and the accumulated charge register might be combined.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents. Notwithstanding, none of the claims are intended to embrace subject matter which fails to satisfy the requirement of Sections 101, 102, or 103 of the Patent Act, nor should they be interpreted in such a way. Any unintended embracement of such subject matter is hereby disclaimed.

Except as stated immediately above, nothing which has been stated or illustrated is intended or should be interpreted to cause a dedication of any component, step, feature, object, benefit, advantage, or equivalent to the public, regardless of whether it is or is not recited in the claims.

The invention claimed is:

1. A coulomb counter circuit comprising:
    a plurality of different inputs, each configured to receive an input signal indicative of current traveling through a resistance to a load;
    for each input signal, an integrator configured to generate an integrated output representative of an integration of the input signal; and
    a summer configured to generate a summed output which is representative of the sum of each of the integrated outputs, weighted inversely proportional to the resistance that is associated with the integrated output, each of the weightings being substantially different.

2. The coulomb counter circuit of claim 1 wherein each input is a differential input.

3. The coulomb counter circuit of claim 2 wherein each differential input is configured to be connected across each resistance.

4. The coulomb counter circuit of claim 1 wherein each of the weightings is at least an order of magnitude different from each of the other weightings.

5. The coulomb counter circuit of claim 1 wherein the plurality of different inputs consist essentially of two different inputs.

6. The coulomb counter circuit of claim 1 wherein the plurality of different inputs consist essentially of three different inputs.

7. The coulomb counter circuit of claim 1 wherein:
    each input signal is an analog signal; and
    each integrator is an analog integrator.

8. The coulomb counter circuit of claim 7 wherein each input is a differential input and further comprising, for each different input, a switching network configured to switch the polarity of the differential input to the integrator associated with the different input.

9. The coulomb counter circuit of claim 8 further comprising a register configured to accumulate a count representing an amount of charge.

10. The coulomb counter circuit of claim 1:
wherein each input signal is an analog signal;
wherein each integrator is a digital integrator; and
further comprising, for each analog input signal, an analog-to-digital converter configured to convert the analog input signal into a digital input signal.

11. A coulomb counter circuit comprising:
a plurality of different resistances, each having a substantially different value and being configure to be connected in series between a source and a load;
for each different resistance, an integrator configured to generate an integrated output representative of an integration of the current traveling through the different resistance; and
a summer configured to generate a summed output which is representative of the sum of each of the integrated outputs, weighted inversely proportional to the resistance that is associated with the integrated output.

12. The coulomb counter circuit of claim 11 wherein the resistance of each of the resistances is at least an order of magnitude different from the resistances of the each of the other resistances.

13. The coulomb counter circuit of claim 11 wherein each integrator has a differential input connected across the resistance associated with the integrator.

14. A circuit comprising:
a source of electrical energy;
a plurality of current loads, each of a different amount;
for each current load, a resistance connected in series between the source and the current load, the resistance being weighted inversely proportional to the amount of the current load with respect to the other resistances;
for each resistance, an integrator configured to generate an integrated output representative of an integration of the current traveling through the resistance; and
a summer configured to generate a summed output which is representative of the sum of each of the integrated outputs, weighted inversely proportional to the resistance that is associated with the integrated output.

15. The circuit of claim 14 wherein the amount of each current load is at least an order of magnitude different from the amount of the other current loads.

16. The coulomb counter circuit of claim 14 wherein each integrator has a differential input connected across the resistance associated with the integrator.

17. The coulomb counter circuit of claim 14 wherein all of the resistances are connected in series between the source and their respective current load at the same time.

* * * * *